(12) United States Patent
Thoumazet et al.

(10) Patent No.: US 9,059,425 B2
(45) Date of Patent: Jun. 16, 2015

(54) MULTILAYER ELECTRONIC DEVICE HAVING ONE OR MORE BARRIER STACKS

(75) Inventors: Claire Thoumazet, Paris (FR); Martin Python, Vesin/FR (CH); Charles Leyder, Paris (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

(21) Appl. No.: 14/110,233

(22) PCT Filed: Apr. 6, 2012

(86) PCT No.: PCT/FR2012/050756
§ 371 (c)(1),
(2), (4) Date: Oct. 31, 2013

(87) PCT Pub. No.: WO2012/143648
PCT Pub. Date: Oct. 26, 2012

(65) Prior Publication Data
US 2014/0054578 A1    Feb. 27, 2014

(30) Foreign Application Priority Data

Apr. 8, 2011   (FR) ...................................... 11 53109

(51) Int. Cl.
*H01L 51/52*  (2006.01)
*H01L 51/44*  (2006.01)
(Continued)

(52) U.S. Cl.
CPC ............ *H01L 51/5215* (2013.01); *G02B 1/116* (2013.01); *H01L 31/02168* (2013.01); *H01L 31/022466* (2013.01); *H01L 31/048* (2013.01); *H01L 51/5256* (2013.01); *H01L 51/5281* (2013.01); *H01L 2251/5338* (2013.01);
(Continued)

(58) Field of Classification Search
CPC ............ H01L 51/5215; H01L 51/5234; H01L 51/442
USPC .................... 257/40, 759, E51.002, E51.003, 257/E51.012, E51.027; 438/82, 99
See application file for complete search history.

(56) References Cited

U.S. PATENT DOCUMENTS 5,405,702 A  *  4/1995  Piotrowski et al. ........... 428/458
5,528,614 A  *  6/1996  Watanabe .................. 372/45.01
(Continued)

FOREIGN PATENT DOCUMENTS

EP       0 831 360       3/1998
FR       2 919 114       1/2009
(Continued)

OTHER PUBLICATIONS

International Search Report as issued for International Application No. PCT/FR2012/050756, dated Jul. 24, 2012.

*Primary Examiner* — Ida M Soward
(74) *Attorney, Agent, or Firm* — Pillsbury Winthrop Shaw Pittman LLP

(57) ABSTRACT

A device includes an organic polymer layer and an electrode positioned against the polymer layer, the electrode being constituted by a transparent stack of thin layers including an alternation of n thin metallic layers and of (n+1) antireflection coatings, with $n \geq 1$, where each thin metallic layer is placed between two antireflection coatings. At least one of the two antireflection coatings located at the ends of the constituent stack of the electrode includes a stack that is a barrier to moisture and gases, the layers of the or each barrier stack having alternately lower and higher densities.

23 Claims, 4 Drawing Sheets

(51) Int. Cl.
*H01L 31/0216* (2014.01)
*H01L 31/0224* (2006.01)
*H01L 31/048* (2014.01)

(52) U.S. Cl.
CPC ............ *H01L51/442* (2013.01); *Y02E 10/549* (2013.01); *H01L 51/5234* (2013.01)

(56) References Cited

U.S. PATENT DOCUMENTS

| | | | |
|---|---|---|---|
| 6,268,695 B1 * | 7/2001 | Affinito | 313/504 |
| 6,570,325 B2 * | 5/2003 | Graff et al. | 313/506 |
| 6,781,801 B2 * | 8/2004 | Heinonen et al. | 360/324.2 |
| 7,067,838 B1 * | 6/2006 | Sato et al. | 257/17 |
| 7,074,501 B2 * | 7/2006 | Czeremuszkin et al. | 428/690 |
| 7,781,034 B2 * | 8/2010 | Yializis et al. | 428/34.7 |
| 8,133,577 B2 * | 3/2012 | Kuramachi et al. | 428/220 |
| 8,358,673 B2 * | 1/2013 | Bhat et al. | 372/45.01 |
| 8,766,280 B2 * | 7/2014 | Thoumazet et al. | 257/79 |
| 2003/0103543 A1 * | 6/2003 | Moser et al. | 372/96 |
| 2003/0186064 A1 | 10/2003 | Murata et al. | |
| 2003/0203210 A1 * | 10/2003 | Graff et al. | 428/412 |
| 2005/0233123 A1 * | 10/2005 | Weber et al. | 428/215 |
| 2009/0109537 A1 * | 4/2009 | Bright et al. | 359/588 |
| 2011/0032622 A1 * | 2/2011 | Kim et al. | 359/609 |
| 2011/0085233 A1 * | 4/2011 | Furusato | 359/359 |
| 2012/0032209 A1 * | 2/2012 | Shioda et al. | 257/94 |
| 2012/0056157 A1 * | 3/2012 | Hikosaka et al. | 257/13 |
| 2012/0228668 A1 * | 9/2012 | Thoumazet et al. | 257/100 |

FOREIGN PATENT DOCUMENTS

| | | |
|---|---|---|
| FR | 2 925 981 | 7/2009 |
| FR | 2 936 510 | 4/2010 |
| FR | 2 942 794 | 9/2010 |
| FR | 2 949 775 | 3/2011 |
| WO | WO 2008/029060 | 3/2008 |

* cited by examiner

MULTILAYER ELECTRONIC DEVICE HAVING ONE OR MORE BARRIER STACKS

CROSS-REFERENCE TO RELATED APPLICATIONS

This application is the U.S. National Stage of PCT/FR2012/050756, filed Apr. 6, 2012, which in turn claims priority to French Application No. 1153109, filed Apr. 8, 2011. The content of both applications are incorporated herein by reference in their entirety

FIELD

The present invention relates to a multilayer electronic device, and to a process for manufacturing such a device.

BACKGROUND

A multilayer electronic device comprises a functional element consisting of an active part and two electrically conducting coatings on either side of this active part. Examples of multilayer electronic devices comprise in particular; organic light-emitting diode (OLED) devices in which the functional element is an OLED, the active part of which is designed to convert electrical energy into radiation; photovoltaic devices in which the functional element is a photovoltaic cell, the active part of which is designed to convert the energy from radiation into electrical energy; electrochromic devices in which the functional element is an electrochromic system, the active part of which is designed to switch reversibly between a first state and a second state having optical transmission properties and/or energy transmission properties different from those of the first state.

As is known, irrespective of the technology employed, the functional elements of a multilayer electronic device are liable to be degraded due to the effect of environmental conditions, especially due to the effect of exposure to air or moisture. As an example, in the case of OLEDs or organic photovoltaic cells, the organic materials are particularly sensitive to the environmental conditions. In the case of electrochromic systems or thin-film photovoltaic cells comprising an inorganic absorber layer, the transparent electrodes, which are based on a TCO (transparent conductive oxide) layer or based on a transparent metallic layer, are also liable to be degraded due to the effect of environmental conditions.

To protect the functional elements of a multilayer electronic device from degradation due to exposure to air or moisture, it is known to manufacture the device with a laminated structure in which the functional elements are encapsulated with a front protection substrate and possibly with a back protection substrate.

Depending on the application of the device, the front and back substrates may be made of glass or an organic polymer material. An OLED or a photovoltaic cell encapsulated with a flexible polymer substrate, rather than a glass substrate, has the advantage of being pliable, ultra-thin and light. Moreover, in the case of an electrochromic system or a photovoltaic cell that includes an absorber layer based on a chalcopyrite compound, especially one containing copper, indium and selenium, called a CIS absorber layer, to which may optionally be added gallium (CIGS absorber layer), aluminum or sulfur, the device is conventionally assembled by lamination using an interlayer made of an organic polymer material. The lamination interlayer, which is positioned between an electrode of the functional element and the corresponding protection substrate, then makes it possible to guarantee proper cohesion of the device.

However, it has been found that, when a multilayer electronic device comprises an organic polymer lamination interlayer or an organic polymer substrate positioned against a functional element sensitive to air and/or moisture, the device has a high rate of degradation. This is because the presence of the organic polymer lamination interlayer, which tends to store moisture, or the presence of the organic polymer substrate, which has a high permeability, promotes the migration of contaminating species such as water vapor or oxygen into the sensitive functional element, and therefore impairs the properties of this functional element.

SUMMARY

The invention is more particularly intended to remedy these drawbacks by providing a multilayer electronic device that has a good long-term performance level owing to an improved resistance of its functional elements to air and moisture, and the manufacturing process of which is simple and easily industrializable.

For this purpose, one subject of the invention is a multilayer electronic device, comprising an organic polymer layer and an electrode positioned against this polymer layer, the electrode being constituted by a transparent stack of thin layers comprising an alternation of n thin metallic layers, especially of thin layers based on silver or on a metal alloy containing silver, and of (n+1) antireflection coatings, with n≥1, where each thin metallic layer is placed between two antireflection coatings, characterized in that the electrode comprises:

a first barrier stack, which is a barrier to moisture and to gases, in the end antireflection coating which is placed under the n thin metallic layers in the direction of deposition of the constituent stack of the electrode, the first barrier stack comprising at least four layers having alternately lower and higher densities, and/or a second barrier stack, which is a barrier to moisture and to gases, in the end antireflection coating which is placed on top of the n thin metallic layers in the direction of deposition of the constituent stack of the electrode, the second barrier stack comprising at least three layers having alternately lower and higher densities.

Within the meaning of the invention, a thin layer is understood to mean a layer having a thickness of less than 1 micrometer. Furthermore, within the context of the invention, a layer or a stack of layers is considered to be transparent when it is transparent within at least the useful wavelength ranges for the intended application. As an example, in the case of a photovoltaic device comprising photovoltaic cells based on polycrystalline silicon, each transparent layer or stack of layers is advantageously transparent within the wavelength range between 400 nm and 1200 nm, which are the useful wavelengths for this type of cell.

In a device according to the invention, the electrode must have an electrical conductivity above a required minimum threshold. Within the context of the invention, the electrode of the device advantageously has a sheet resistance of less than 10 ohms per square, preferably of less than 5 ohms per square. This electrical conductivity of the electrode is part of the properties of the device which, owing to the invention, are barely or not at all degraded under the effect of the environmental conditions.

In accordance with the objectives of the invention, the presence of at least one multilayer barrier stack, the successive layers of which have alternately lower and higher densities, makes it possible to limit the migration of contaminating species such as water vapor or oxygen from the polymer layer towards the sensitive layers of the electronic device. In particular, it is observed that the efficiency of such a multilayer barrier stack is better than that obtained with a single-layer barrier coating, for one and the same overall geometric thickness. Indeed, the presence of a multiplicity of interfaces within the multilayer barrier stack, which results from the alternation of layers of lower density with layers of higher density, increases the distance required for the contaminating species to reach the sensitive layers. The barrier effect increases with the multiplicity of interfaces in the barrier stack.

Furthermore, it appears that a multilayer barrier has better mechanical properties than a single-layer barrier of the same thickness. The presence of the successive layers makes it possible to relax the stresses, which limits the formation of defects within the barrier. A multilayer barrier is thus less likely to generate cracks, which is favorable in terms of protection since the cracks are favored paths for the diffusion of contaminating species such as water vapor or oxygen.

Furthermore, owing to the invention, it is an electrode of the electronic device that itself acts as a barrier to moisture and to gases. It is hence not necessary to provide supplementary barrier layers, in addition to the functional elements of the device. Many advantages result therefrom. In particular, in comparison with an electronic device in which supplementary barrier layers are provided between the polymer layer and the electrode;

Insofar as each barrier stack is integrated directly into an antireflection coating of the electrode, this stack simultaneously provides a barrier function to moisture and to gases and an antireflection function of the metallic layers of the electrode. The taking on of these two functions by one and the same stack makes it possible to limit the number of layers, and thus to make savings in material compared to the case where supplementary barrier layers are provided. The reduction of the number of layers also has the advantage of limiting the surface roughness of the electrode, which makes it possible to satisfy, in particular, the requirements of low roughness imposed for the subsequent deposition of active layers of OLEDs or of organic photovoltaic cells. By way of example, for the deposition of the organic layers of an OLED, an RMS roughness of less than 10 nm is often necessary, preferably of less than 2 nm or even less than 1 nm.

Due to the reduction of the number of layers, the number of depositions of layers to be provided for the manufacture of the device is also reduced. The process for manufacturing the device is thus simplified, quick and easily industrializable. Advantageously, the layers of the barrier stack may be deposited continuously with the other layers of the electrode, according to the same deposition process, in particular by magnetron sputtering. Such a continuous deposition process makes it possible to avoid venting of the interface between the barrier layers and the other layers of the electrode, which would be liable to induce an increase in the surface roughness.

As is known, an electrode containing thin metallic layers is constituted by a stack of thin layers, the optical properties of which are optimized interferentially. More specifically, in the constituent stack of the electrode, the thin metallic layer or layers give the electrode its electrical conduction properties, whereas the antireflection coatings which surround them act on the optical appearance interferentially and give the electrode its transparency properties. Indeed, although the thin metallic layers make it possible to obtain desired electrical conduction properties even at a small geometric thickness, of the order of 10 nm for each thin metallic layer, they strongly oppose however the passage of radiation, in particular in the visible wavelength range. Hence, antireflection coatings on both sides of each thin metallic layer are necessary in order to ensure a good light transmission. However, if supplementary barrier layers are put in place between the polymer layer and the electrode, which typically have thicknesses of the order of ten or a hundred nanometers for each barrier layer, this disturbs the stack of the electrode optically. The invention makes it possible to overcome this problem: by integrating each barrier stack directly into the stack of the electrode, it is the overall stack including the barrier layers that is optimized optically.

Other advantageous features of the invention are described below, which may be taken in isolation or in any technical possible combination.

According to one advantageous feature, each antireflection coating which is placed under, in the direction of deposition of the constituent stack of the electrode, a thin metallic layer comprises, as layer subjacent to the thin metallic layer, a wetting layer based on crystalline oxide, especially based on zinc oxide ZnO. This wetting layer is intended to promote the wetting and the nucleation of the thin metallic layer.

According to another advantageous feature, each antireflection coating that is placed on top, in the direction of deposition of the constituent stack of the electrode, of a thin metallic layer comprises, as layer superjacent to the thin metallic layer, an oxidized or unoxidized thin metallic overblocker layer. This overblocker layer is intended to protect the thin metallic layer during the deposition of a subsequent layer, for example if the latter is deposited under an oxidizing or nitriding atmosphere, and during a possible subsequent heat treatment.

Each thin metallic layer of the electrode may also be deposited on and in contact with a thin metallic underblocker layer. The stack of the electrode may therefore comprise an overblocker layer and/or an underblocker layer surrounding the or each thin metallic layer. These blocker, underblocker and/or overblocker, layers are very thin, normally having a thickness of less than 1 nm, so as not to adversely affect the light transmission of the stack. The blocker layers act as sacrificial layers, in particular capable of capturing oxygen.

The blocker, underblocker and/or overblocker, layers are especially based on a metal chosen from titanium, nickel, chromium, niobium, or on an alloy of these various metals. Mention may be made of nickel-titanium alloys (especially those comprising around 50% by weight of each metal) or nickel-chromium alloys (especially those comprising 80% by weight of nickel and 20% by weight of chromium). The overblocker layer may also be constituted of several superposed layers, for example, on moving away from the polymer layer, of titanium then of a nickel alloy (especially a nickel-chromium alloy) or vice versa. The various metals or alloys mentioned may also be oxidized, and may especially be substoichiometric in oxygen, for example in the case of titanium $TiO_x$ with $0 \leq x \leq 3$, or superstoichiometric in oxygen, for example in the case of titanium $TiO_x$ with $2 \leq x < 2.5$.

According to one feature, the layer of the stack of the electrode which is located on the opposite side from the polymer layer may be a layer referred to as a work function matching layer, having a work function Ws greater than or equal to 4.5 eV, preferably greater than or equal to 5 eV. This work function matching layer may be, in particular, based on a single or mixed oxide, for example based on at least one of the following, optionally doped or substoichiometric, metal oxides: tin oxide, indium oxide, zinc oxide, aluminum oxide, chromium oxide, titanium oxide, molybdenum oxide, zirconium oxide, antimony oxide, tantalum oxide, silicon oxide, niobium oxide.

According to one advantageous feature, the electrode has, on the layer of the stack of the electrode which is located on the opposite side from the polymer layer, an RMS roughness of less than or equal to 10 nm, preferably of less than or equal to 5 nm, more preferably of less than or equal to 2 nm or even 1 nm. This makes it possible, especially in the case of an OLED device, to avoid spike effects which drastically reduce the lifetime and the reliability of the device. The RMS roughness stands for the root mean square roughness. This is a measure that consists in measuring the value of the root mean square deviation of the roughness.

According to one advantageous feature, at least one barrier stack of the electrode comprises at least three successive thin layers having alternately lower and higher degrees of crystallinity, the ratio of the degree of crystallinity of a layer of higher degree of crystallinity to the degree of crystallinity of a layer of lower degree of crystallinity being greater than or equal to 1.1. The degree of crystallinity considered here may be the volume degree of crystallinity defined as the ratio of the volume of crystalline material present in the layer to the total volume of material in the layer.

In practice, the degrees of crystallinity of two successive layers of the barrier stack may be determined and compared by making an X-ray diffractometry measurement, especially in a Bragg-Brentano configuration, on each of the two layers. A transmission electron microscopy (TEM) measurement may also be carried out, in particular in the case where two successive layers of the barrier stack are of the same chemical nature but of different degrees of crystallinity.

Preferably, the aforementioned at least three successive layers are alternately in an amorphous state and in an at least partially crystalline state. In other words, the or each layer of lower degree of crystallinity is in an amorphous state, with a zero degree of crystallinity. Within the meaning of the invention, a layer is said to be in an amorphous state if, when using an X-ray diffractometry measurement in a Bragg-Brentano configuration on the layer, no diffraction peak having an intensity equal to or greater than twice the standard deviation of the background noise of the measurement is detected. Conversely, a layer is said to be in an at least partially crystalline state if, when using an X-ray diffractometry measurement in a Bragg-Brentano configuration on the layer, at least one diffraction peak having an intensity equal to or greater than twice the standard deviation of the background noise of the measurement is detected.

The alternation of layers having substantially different degrees of crystallinity makes it possible to decouple the permeation paths of contaminating species, such as water vapor or oxygen, between one layer and the next layer. The permeation paths in the barrier stack, and consequently the permeation times, are thus significantly lengthened. One particularly favorable configuration for this permeation path decoupling effect is the alternation between amorphous layers and crystalline layers.

According to one advantageous feature, at least one barrier stack of the electrode comprises at least one sequence of layers consisting of a retention layer inserted between two high-activation-energy layers, in which:

for each of the two high-activation-energy layers, the difference in activation energy for water vapor permeation between, on the one hand, a reference substrate coated with the high-activation-energy layer and, on the other hand, this same reference substrate when bare is greater than or equal to 5 kJ/mol, preferably greater than or equal to 20 kJ/mol; and the ratio of the effective water vapor diffusivity in the retention layer on a reference substrate to the water vapor diffusivity in this same reference substrate when bare is strictly less than 0.1.

As a nonlimiting example, the reference substrate used for comparing the activation energies and/or diffusivities is a film of polyethylene terephthalate (PET) having a geometric thickness of 0.125 mm.

The presence of at least one barrier stack comprising such a sandwich structure, in which a water vapor retention layer is inserted between two high-activation-energy layers for water vapor permeation, makes it possible to limit and retard the migration of water vapor from the polymer layer into the sensitive layers. Firstly, it is difficult for water vapor to penetrate into the high-activation-energy layers. Secondly, the retention layer stores water vapor. The specific sandwich arrangement of the barrier stack greatly facilitates water vapor trapping in the retention layer. This is because water vapor that succeeds in passing through a first high-activation-energy layer of the barrier stack passes into the retention layer and, as the second high-activation-energy layer of the barrier stack greatly limits the possibilities of the water vapor leaving the retention layer, the water vapor is largely trapped in the retention layer. The permeation of water vapor into the sensitive layers is thus greatly reduced and retarded.

The permeation of a gas through a solid medium is a thermally activated process that can be described by an Arrhenius law:

$$P = P_0 \cdot e^{(+E_a/kT)} \qquad (1)$$

where
P is the permeation;
$P_0$ is a permeation constant specific to the system;
k is Boltzmann's constant;
T is the temperature; and
$E_a$ is the activation energy for permeation.

It follows from equation (1) that it is possible to determine the activation energy $E_a$ by measuring the permeation P as a function of the temperature T. It is thus possible to determine and compare the activation energy of a bare substrate with the activation energy of a substrate coated with a layer.

Moreover, the permeation P is given by the equation:

$$P = S \cdot D \qquad (2)$$

where
S is the solubility, or the effective solubility in the case of a layer on a substrate, and
D is the diffusivity, or the effective diffusivity in the case of a layer on a substrate.

The solubility describes the propensity of the gas to be in the solid medium, whereas the diffusivity describes the kinetics of migration of the gas in the solid medium. It follows from equations (1) and (2) above that the activation energy $E_a$ incorporates the two effects of solubility and diffusivity. In practice, in the case of a single polymer film or a monolayer, the diffusivity effect is dominated by the solubility effect. However, in the case of a multilayer stack, the diffusivity effect may become important, or even predominant.

According to the preceding feature, a barrier stack is provided that has a high overall activation energy for water vapor permeation, and the influence of diffusivity is increased by virtue of the sandwich structure, in which the central layer is a retention layer having a low water vapor diffusivity. The water vapor diffusivity in the retention layer may advantageously decrease when the water vapor concentration in the retention layer increases. This retention effect may be due to a particular affinity between the water vapor and the constituent material of the retention layer, for example a chemical affinity, a polar affinity or more generally electronic affinity, especially linked to Van der Waals interactions. It is thus possible for the water vapor diffusion time in the barrier stack to be significantly increased.

Within the context of the invention, the activation energy $E_a$ for water vapor permeation of a substrate, whether bare or coated with a layer, is determined by measuring the water vapor transfer rate or WVTR through the substrate, whether bare or coated, for various temperature and humidity conditions. As is known, the permeation P is proportional to the WVTR. Equation (1) is then used to deduce the value of the activation energy $E_a$, which is obtained from the slope of the straight line (or the derivative of the function) representative of the variation of Ln(WVTR) as a function of 1/T. In practice, WVTR measurements may be carried out using a MOCON AQUATRAN system. When the WVTR values are below the detection limit of the MOCON system, they may be determined by a conventional calcium test.

Within the context of the invention, the effective diffusivity of water vapor in a layer positioned on a substrate is determined by measuring the amount of water vapor that diffuses into the layer from the substrate at various times, for a given temperature lying within the operating range of the device in which the multilayer component is intended to be incorporated. Likewise, the diffusivity of water vapor in a substrate is determined by measuring the amount of water vapor that diffuses into the substrate at various times, for a given temperature lying within the operating range of the device. These measurements may be carried out in particular using a MOCON AQUATRAN system. For comparison between two diffusivities, the measurements for determining the two diffusivities must be carried out under the same temperature and humidity conditions.

An example of a sequence in which a retention layer is inserted between two high-activation-energy layers while satisfying the preceding feature is the sequence comprising a ZnO layer having a geometric thickness of 50 nm inserted between two $Si_3N_4$ layers having a geometric thickness of 50 nm.

According to one advantageous feature, the constituent layers of each barrier stack of the electrode have alternately lower and higher refractive indices. For suitable geometric thicknesses of its constituent layers, the barrier stack may then constitute an interference filter. The barrier stack thus participates in the antireflection effect of the thin metallic layers of the electrode. In practice, it is the overall stack of the electrode that is optimized optically. Suitable geometric thickness values of the layers of the electrode may be selected especially by means of optimization software.

According to one feature, for each barrier stack of the electrode, each thin layer of the barrier stack has a geometric thickness of less than 200 nm, preferably less than 100 nm and more preferably between 5 nm and 70 nm.

Each thin layer of a barrier stack of the electrode may in particular be an optionally doped oxide, nitride or oxynitride layer. As an example, ZnO, $Si_3N_4$ or $SiO_2$ layers may be doped with aluminum, especially so as to improve their electrical conductivity. The layers of the barrier stack may be deposited by conventional thin-layer deposition processes such as, by way of nonlimiting examples, magnetron sputtering; chemical vapor deposition (CVD), in particular plasma-enhanced chemical vapor deposition (PECVD); atomic layer deposition (ALD); or a combination of these processes, the deposition process chosen possibly being different from one layer to another layer of the barrier stack. Advantageously, when the layers of the barrier stack are deposited by magnetron sputtering, it is possible to deposit the whole of the stack of the electrode on one and the same line.

According to one advantageous feature, the polymer layer comprises, on one of its faces, an interfacial layer which is positioned against the electrode. This interfacial layer is an organic layer, for example of the acrylic or epoxy resin type, or a hybrid organic-inorganic layer, in which the inorganic part, which may for example be silica $SiO_x$, represents between 0% and 50% by volume of the layer. This interfacial layer acts in particular as a smoothing or planarization layer.

The polymer layer against which the electrode is positioned may be a substrate of the device. The flexible polymer substrate of the device may especially be a layer based on polyethylene terephthalate (PET), polyethylene naphthalate (PEN), polycarbonate, polyurethane, polymethyl methacrylate, polyamide, polyimide, a fluoropolymer, such as ethylene-tetrafluoroethylene (ETFE), polyvinylidene fluoride (PVDF), polychlorotrifluoroethylene (PCTFE), ethylene-chlorotrifluoroethylene (ECTFE), fluorinated ethylene-propylene copolymers (FEP).

As a variant, the polymer layer against which the electrode is positioned may be a lamination interlayer for bonding to a rigid or flexible substrate of the device. This polymer lamination interlayer may be, especially, a layer based on polyvinyl butyral (PVB), ethylene-vinyl acetate (EVA), polyethylene (PE), polyvinyl chloride (PVC), a thermoplastic urethane, an ionomer, a polyolefin-based adhesive or a thermoplastic silicone.

According to one aspect of the invention, the electronic device is an organic light-emitting diode (OLED) device, in which the electrode is an electrode of the organic light-emitting diode and the polymer layer is all or part of a structure for encapsulating the organic light-emitting diode.

According to another aspect of the invention, the electronic device is a photovoltaic device, in which the electrode is an electrode of the photovoltaic cell and the polymer layer is all or part of a structure for encapsulating the photovoltaic cell.

According to yet another aspect of the invention, the electronic device is an electrochromic device, in which the electrode is an electrode of the electrochromic system and the polymer layer is all or part of a structure for encapsulating the electrochromic system.

Another subject of the invention is a process for manufacturing an electronic device as described above, in which at least some of the thin layers of the or each barrier stack are deposited by sputtering, especially magnetron sputtering.

In particular, at least some of the thin layers of the or each barrier stack may be deposited by reactive sputtering, especially reactive magnetron sputtering, by varying, during the deposition, the pressure in the deposition chamber and/or the power and/or the nature or amount of the reactive gas.

Preferably, all of the thin layers of the constituent stack of the electrode, including the layers of the or each barrier stack, are deposited by sputtering, especially magnetron sputtering.

BRIEF DESCRIPTION OF THE DRAWINGS

The features and advantages of the invention will become apparent in the following description of several embodiments of a multilayer electronic device according to the invention, this description being given solely by way of example and with reference to the appended drawings in which.

DETAILED DESCRIPTION

For the sake of visibility, the relative thicknesses of the layers have not been respected in FIGS. 1 to 8.

Figure 1:
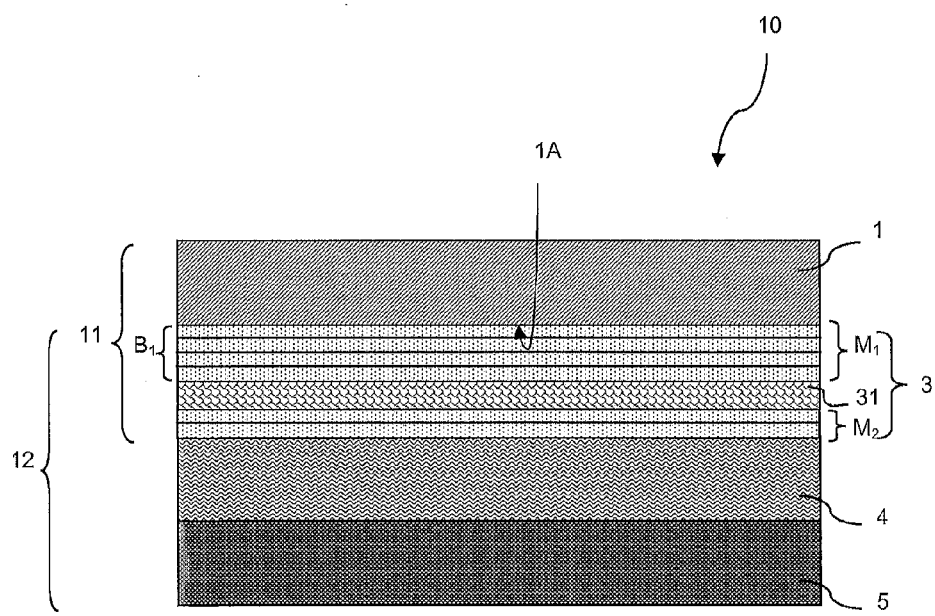
FIG. 1 is a schematic cross section through an OLED device in accordance with a first embodiment of the invention.

In the first embodiment represented in FIG. 1, the organic light-emitting diode device 10 successively comprises a front substrate 1 having a glazing function, a front electrode 3, a stack 4 of organic electroluminescent layers and a back electrode 5. The front electrode 3, the stack 4 of organic layers and the back electrode 5 form an OLED 12, which is the functional element of the device 10. The layers of the OLED 12 are deposited successively on the front substrate 1. The front substrate 1, which is arranged on the side where the radiation is extracted from the device 10, is made of a transparent polymer, especially, as an example, made of polyethylene terephthalate (PET) or polyethylene naphthalate (PEN) having a geometric thickness of a few hundred micrometers.

The stack 4 of organic layers comprises a central electroluminescent layer inserted between an electron transport layer and a hole transport layer, which are themselves inserted between an electron injection layer and a hole injection layer. The front electrode 3 is made of a stack of thin, transparent and electrically conductive layers, comprising a thin silver layer 31 inserted between two antireflection coatings $M_1$ and $M_2$. The back electrode 5 is made of an electrically conductive material, in particular a metallic material of the silver or aluminum type or, especially when the OLED device 10 is both front-emitting and rear-emitting, made of a TCO. The organic layers 4 and the silver layer 31 of the electrode 3 are sensitive layers, the properties of which are liable to be degraded due to the effect of exposure to air or moisture. In particular, in the presence of water vapor or oxygen, the luminescence properties of the organic layers 4 and the conductivity properties of the electrode 3 may be degraded. To protect these sensitive layers with respect to external environmental conditions, the device 10 includes a barrier stack which is integrated into at least one of the antireflection coatings $M_1$, $M_2$ of the front electrode 3. In practice, the layers of the front electrode 3 are deposited successively on a face 1A of the polymer substrate 1, especially by magnetron sputtering, so as to form a multilayer component 11 comprising the superposed substrate 1 and electrode 3. The organic layers 4 and the back electrode 6 are deposited later.

In this embodiment, the electrode 3 comprises a barrier stack $B_1$ in the antireflection coating $M_1$ which is placed under the thin silver layer 31 in a direction of deposition of the layers of the electrode 3. By way of nonlimiting example, the stack of the electrode 3 comprises the succession of the following layers deposited by magnetron sputtering, in the direction of deposition of the layers (the reference numerals indicated are those from FIG. 5):

$Si_3N_4$/ZnO/$Si_3N_4$/ZnO/Ag/Ti/ITO
(32) (33) (34) (35) (31) (36) (37)

In this example, the barrier stack $B_1$ consists of a stack of four thin transparent layers, comprising two layers 32 and 34 of silicon nitride $Si_3N_4$ of relatively lower density, which are alternated with two layers 33 and 35 of zinc oxide ZnO of relatively higher density. The layer 35 of zinc oxide ZnO which is immediately subjacent to the thin silver layer 31 acts as a wetting layer.

Figure 6:
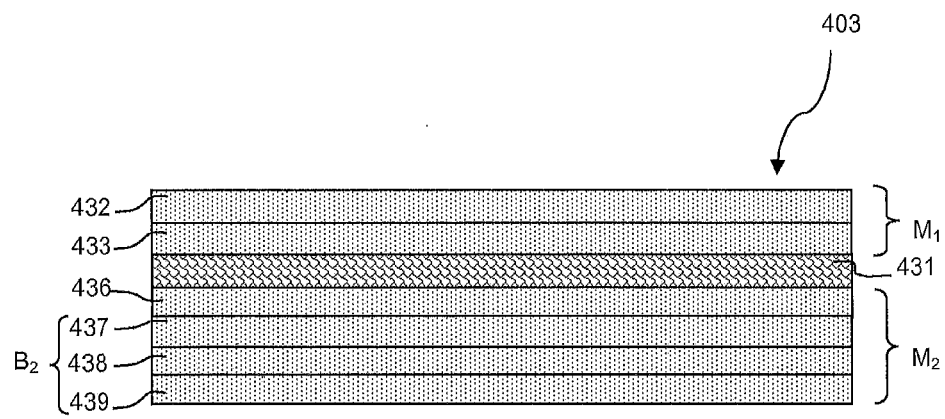
FIG. 6 is a view similar to FIG. 5 for a second structural variant of the electrode.
Figure 7:
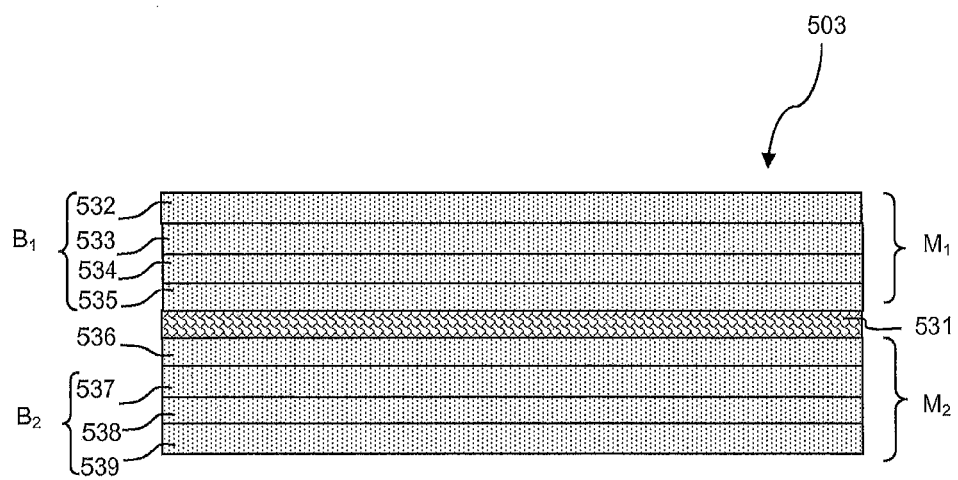
FIG. 7 is a view similar to FIG. 5 for a third structural variant of the electrode.

FIGS. 6 and 7 show two structural variants of the electrode 3.

In the variant from FIG. 6, the electrode 403 comprises a barrier stack $B_2$ in the antireflection coating $M_2$ which is placed on top of the thin silver layer 431 in the direction of deposition of the constituent stack of the electrode. By way of nonlimiting example, the stack of the electrode 403 comprises the succession of the following layers deposited by magnetron sputtering, in the direction of deposition of the layers (the reference numerals indicated are those from FIG. 6):

SnZnO/ZnO/Ag/Ti/$Si_3N_4$/ZnO/Si3N4
(432) (433) (431) (436) (437) (438) (439)

In this example, the barrier stack $B_2$ consists of a stack of three thin transparent layers, comprising two layers 437 and 439 of silicon nitride $Si_3N_4$ of relatively lower density, which surround a layer 438 of zinc oxide ZnO of relatively higher density.

In the variant from FIG. 7, the electrode 503 comprises a barrier stack $B_1$, $B_2$ in each of the two antireflection coatings $M_1$, $M_2$ located at the ends of the constituent stack of the electrode. By way of nonlimiting example, the stack of the electrode 503 comprises the succession of the following layers deposited by magnetron sputtering, in the direction of deposition of the layers (the reference numerals indicated are those from FIG. 7):

$Si_3N_4$/ZnO/$Si_3N_4$/ZnO/Ag/Ti/$Si_3N_4$/ZnO/$Si_3N_4$
(532) (533) (534) (535) (531) (536) (537). (538) (539)

In this example it is observed that the barrier stack $B_1$ is similar to that of the electrode 3 and the barrier stack $B_2$ is similar to that of the electrode 403.

In the preceding examples of stacks, the electrode 3, 403, 503, which integrates at least one barrier stack, makes it possible not only to effectively protect the sensitive layers of the device 10 which are the organic layers 4 and the thin silver layer 31 of the electrode 3, owing to the multiplicity of interfaces within the multilayer barrier stack, but also to guarantee a good transmission of radiation from the OLED 12 to the front of the device. Indeed, the stack of the electrode may be optimized from an optical viewpoint, with geometric thicknesses of the layers that are adapted so that the electrode forms an interference filter.

Furthermore, in the preceding examples of stacks deposited by magnetron sputtering, the layers of silicon nitride $Si_3N_4$ are in an amorphous state, whereas the layers of zinc oxide ZnO are in an at least partially crystalline state. Thus, for each barrier stack $B_1$ and $B_2$ from the preceding examples, the layers of the barrier stack are alternately in an amorphous state and in a crystalline state, and the ratio of the degree of crystallinity of each ZnO layer to the degree of crystallinity of each $Si_3N_4$ layer is infinite since each $Si_3N_4$ layer is in an amorphous state having a zero degree of crystallinity.

Figure 2:
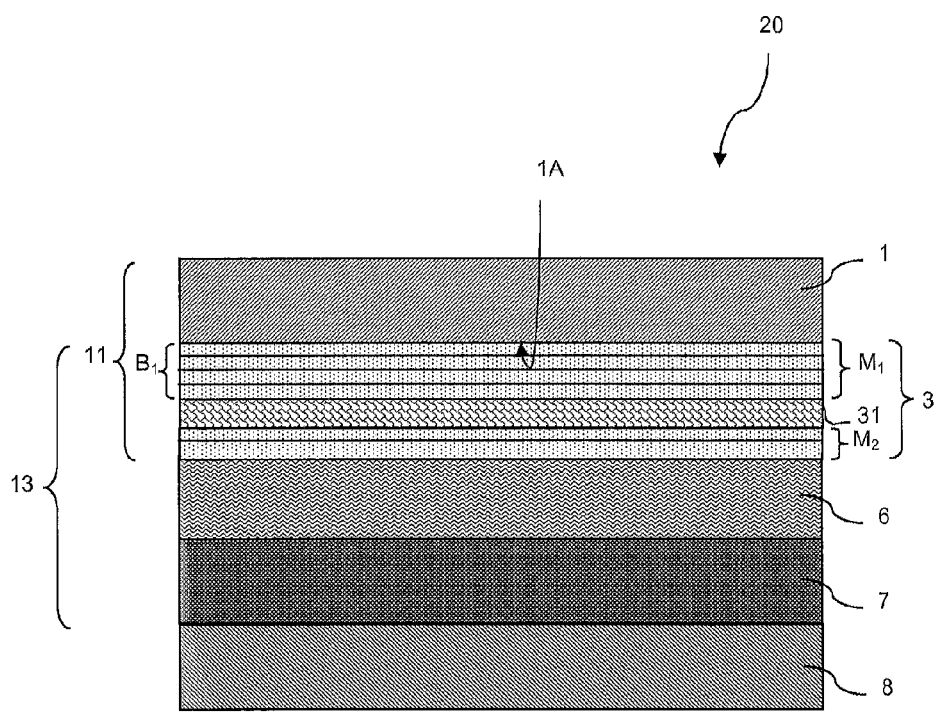
FIG. 2 is a cross section similar to FIG. 1 for a photovoltaic solar module in accordance with a second embodiment of the invention.

In the second embodiment represented in FIG. 2, the elements similar to those of the first embodiment bear identical references. In FIG. 2, the device according to the invention is a thin-film photovoltaic solar module 20, comprising a front substrate 1 having a glazing function and a rear substrate 8 having a support function. The front substrate 1, intended to be arranged on the side where the solar radiation is incident on the module 20, is formed of a transparent polymer, especially, as an example, made of polyethylene terephthalate (PET) or polyethylene naphthalate (PEN) having a geometric thickness of a few hundred micrometers.

The rear substrate 8 is made of any appropriate material, whether transparent or not, and bears, on its face directed towards the inside of the module 20, that is to say on the side where the solar radiation is incident on the module, an electrically conductive layer 7 which forms a back electrode of the photovoltaic cell 13 of the module 20. By way of example, the layer 7 is a metallic layer, especially made of silver or aluminum.

The layer 7 forming the back electrode is surmounted by an absorber layer 6 based on amorphous silicon, suitable for converting solar energy into electrical energy. The absorber layer 6 is itself surmounted by the electrode 3 described previously in reference to FIG. 5, which is the front electrode of the cell 13. The photovoltaic cell 13 of the module 20 is thus formed by the stack of the layers 3, 6 and 7.

Figure 3:
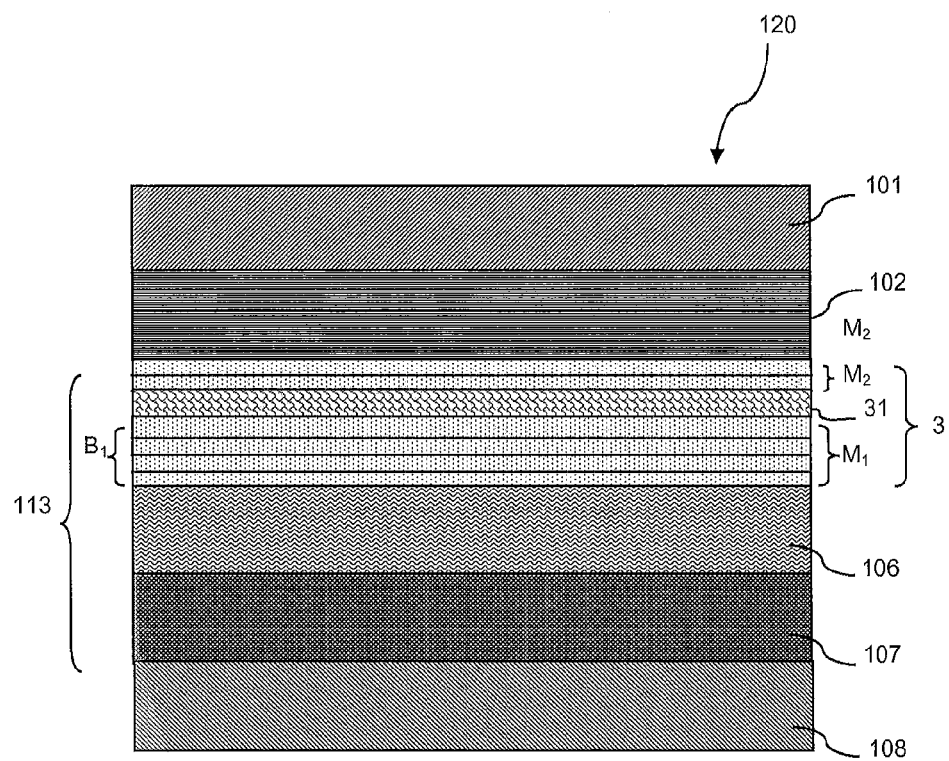
FIG. 3 is a cross section similar to FIG. 1 for a photovoltaic solar module in accordance with a third embodiment of the invention.

In the third embodiment represented in FIG. 3, the elements similar to those of the second embodiment bear identical references increased by 100. The photovoltaic solar module 120 shown in FIG. 3 differs from the module 20 from FIG. 2 in that its absorber layer 106 is based on a chalcopyrite compound, especially CIS or CIGS. As is known, a thin-film photovoltaic module in which the absorber is based on silicon or on cadmium telluride is manufactured in superstrate mode, that is to say by successive deposition of the constituent layers of the device starting from the front substrate, whereas a thin-film photovoltaic module in which the absorber is based on a chalcopyrite compound is manufactured in substrate mode, that is to say by successive deposition of the constituent layers of the cell on the back substrate. Assembly of the module having a chalcopyrite absorber then takes place conventionally by lamination using a polymer interlayer positioned between the front electrode and the front substrate of the module.

In FIG. 3, the module 120 comprises a front substrate 101 having a glazing function and a back substrate 108 having a support function. The front substrate 101, intended to be arranged on the side where the solar radiation is incident on the module 120, is made either of glass or of a transparent polymer. The module 120 also comprises a back substrate 108 which bears, on its face directed toward the inside of the module 120, an electrically conductive layer 107 forming a back electrode of the photovoltaic cell 113 of the module. By way of example, the layer 107 is based on molybdenum.

The layer 107 forming the back electrode is surmounted by the absorber layer 106 based on a chalcopyrite compound, especially CIS or CIGS. The absorber layer 106 is itself surmounted by a layer of cadmium sulfide CdS, not shown, which is optionally combined with a layer of undoped intrinsic ZnO, also not shown. The front electrode of the photovoltaic cell 113 is formed by the electrode 3 described previously with reference to FIG. 5. The photovoltaic cell 113 of the module is thus formed by the stack of layers 3, 106 and 107.

A polymer lamination interlayer 102 made of EVA, provided in order to ensure that the functional layers of the module 120 are held between the front substrate 101 and back substrate 108, is positioned on top of the electrode 3, against the front substrate 101. As a variant, the lamination interlayer 102 may be made of PVB, or of any other material having suitable properties.

Figure 4:
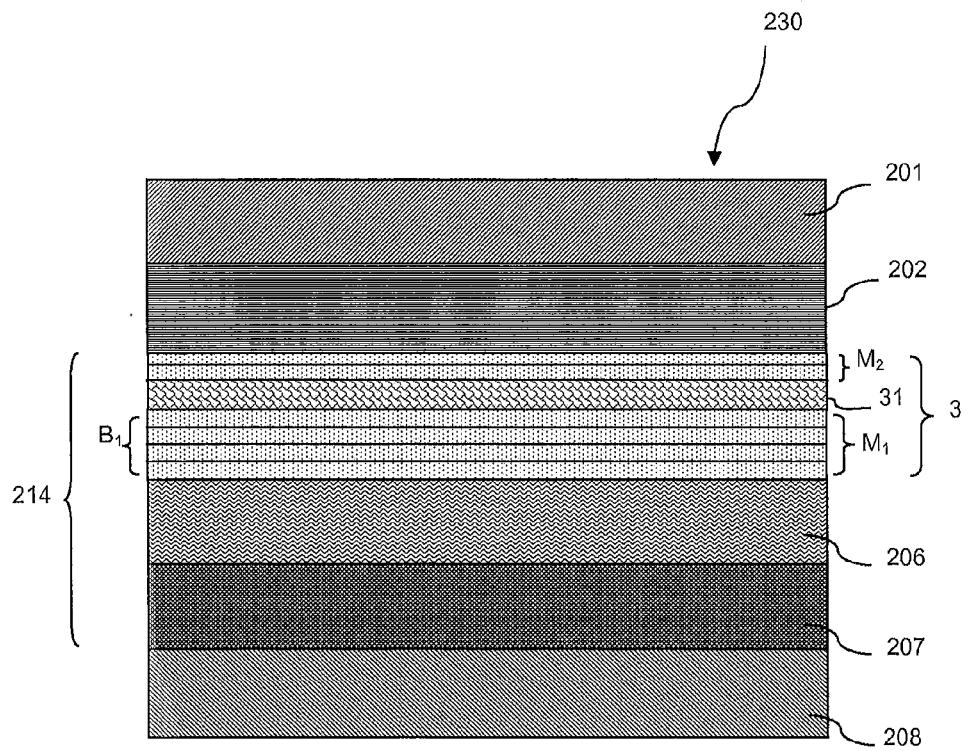
FIG. 4 is a cross section similar to FIG. 1 for an electrochromic device in accordance with a fourth embodiment of the invention.
Figure 5:
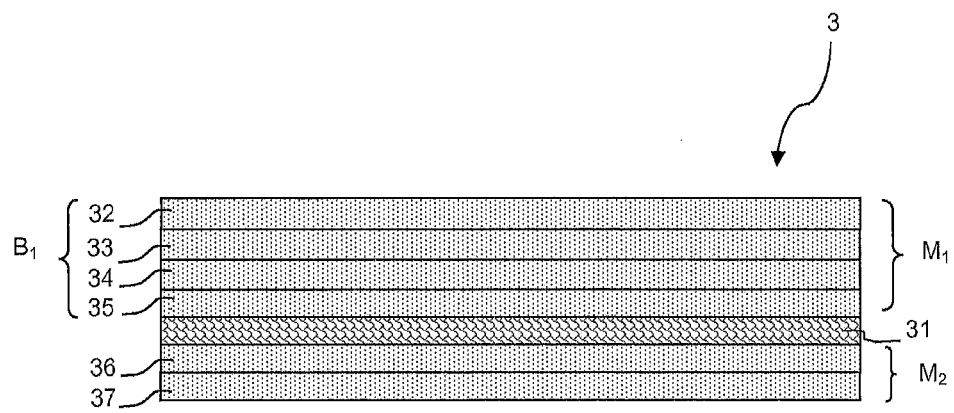
FIG. 5 is a view on a larger scale of the front electrode of the devices from FIGS. 1 to 4 for a first structural variant of the electrode.

In the fourth embodiment represented in FIG. 4, the elements similar to those of the second embodiment bear identical references increased by 200. The device 230 shown in FIG. 4 is an electrochromic device comprising two substrates 201 and 208 made of any suitable transparent material. An electrochromic system 214 is placed between the substrates 201 and 208. The electrochromic system 214 may be of any suitable type. In particular, it may be what is called a hybrid electrochromic system in which two mineral electrochromic layers are separated by an organic electrolyte, or may be an all-solid-state electrochromic system in which the electrochromic layers and the electrolyte are mineral layers.

Irrespective of its type, the electrochromic system 214 comprises, successively starting from the substrate 208, a transparent electrode 207, especially made of a TCO, a stack 206 of electrochromic active layers and the electrode 3 described previously with reference to FIG. 5. A polymer lamination interlayer 202, for example, made of EVA or of any other material having suitable properties, is positioned on top of the electrode 3, against the substrate 201, in order to ensure that the functional layers of the device 230 are held between the substrates 201 and 208.

For each of the devices from FIGS. 2 to 4, as for the OLED device from FIG. 1, the electrode 3 that integrates the barrier stack $B_1$ provides both effective protection of the sensitive layers of the device, in particular of the thin silver layer 31 of the electrode, by preventing the migration of contaminating species, and an optimal transmission of radiation from or toward the active layers of the device.

It should be noted that in the embodiments from FIGS. 1 to 4, the electrode 3 may be replaced, in particular, by the electrode 403 from FIG. 6 or by the electrode 503 from FIG. 7.

An electrode having a barrier stack in each of its two end antireflection coatings, such as the electrode 503 from FIG. 7, finds a particularly advantageous application in the case where a migration of moisture must be avoided in both directions of crossing the electrode. This is especially the case for the electrochromic devices having an all-solid-state electrochromic system in which the electrolyte requires hydration in order to have a sufficient ionic conductivity, such as those described in EP-A-0 831 360. An example of such a device is shown in FIG. 8.

Figure 8:
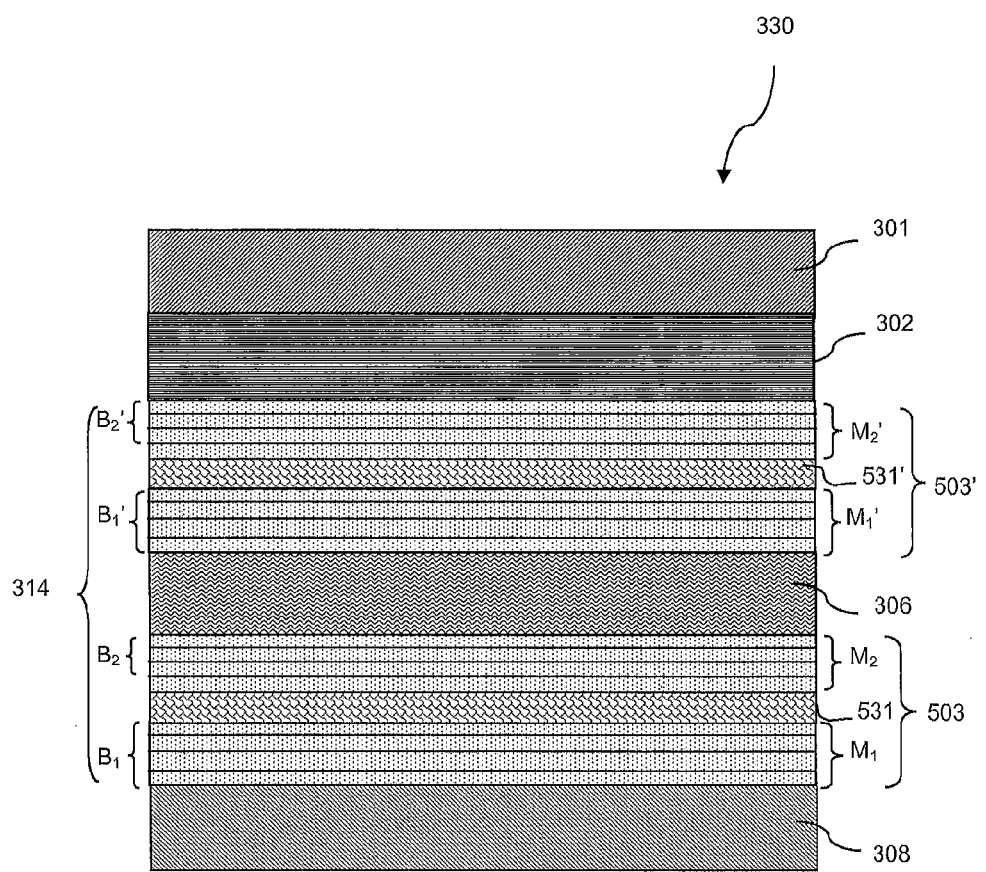
FIG. 8 is a cross section similar to FIG. 1 for an electrochromic device in accordance with a fifth embodiment of the invention.

In FIG. 8, the electrochromic device 330 comprises two substrates 301 and 308 between which is placed an electrochromic system 314 of all-solid-state type. The layers of the electrochromic system 314 are deposited successively onto the substrate 308, for example by magnetron sputtering. In this example, the substrate 308 is made of a transparent polymer, especially made of polyethylene terephthalate (PET) or of polyethylene naphthalate (PEN) having a geometric thickness of a few hundred micrometers. The substrate 301 is itself made either of glass or of a transparent polymer.

The electrochromic system 314 successively comprises, starting from the substrate 308, a first electrode 503 as described above in reference to FIG. 7, a stack 306 of electrochromic active layers and a second electrode 503' as described above in reference to FIG. 7. The stack 306 of active layers comprises an electrolyte, formed in particular by a layer of hydrated tantalum oxide, which is inserted between a layer made of a cathodic electrochromic material, for example made of tungsten oxide $WO_3$, and a layer made of an anodic electrochromic material, for example made of iridium oxide $IrO_x$. A polymer lamination interlayer 302, for example made of EVA or of any other material having suitable properties, is positioned on top of the electrode 503', against the substrate 301.

In this device 330, it is important to maintain the degree of hydration of the electrolyte included in the stack 306 at a constant level or at the very least at a high enough level to retain its functionality, but also to protect the sensitive layers which are the thin silver layers 531 and 531' of the electrodes with respect to moisture which is capable of originating simultaneously from the polymer substrate 308, from the stack 306 and from the polymer lamination interlayer 302. The use of the electrodes 503 and 503', which have a barrier stack in each of their two end antireflection coatings, makes it possible to achieve these objectives by preventing the migration of moisture in both directions for crossing the electrodes 503 and 503'.

As is apparent from the preceding embodiments, in a device in accordance with the invention, at least one electrode integrates a barrier function and gives this device an improved resistance with respect to any degradation induced by exposure to air or moisture. This improved resistance is obtained without impairing the transmission of radiation from or toward the active layers of the device since the stack of the electrode can be optically optimized.

EXAMPLES

Examples of electrodes having thin layers of silver from the prior art, respectively having one layer of silver (example No. 1) and having two layers of silver (example No. 2), deposited on a flexible substrate made of polyethylene terephthalate (PET) having a geometric thickness of 0.125 mm, are given in table 1 below. In these examples, the polyethylene terephthalate substrate comprises, on one of its faces, an interfacial layer based on acrylic resin, crosslinked under UV radiation and of micron-sized thickness, which is positioned against the electrode. In table 1 below, the notation "PET" denotes the polyethylene terephthalate substrate coated with the interfacial layer based on acrylic resin.

The properties of the stacks given in table 1 are the following:
- $T_L$: the light transmission in the visible in %, measured under illuminant D65 at 2° observer conditions;
- $R_L$: the light reflection in the visible in %, measured under illuminant D65 at 2° observer conditions;
- A: the light absorption in the visible in %, such that:

$$T_L + R_L + A = 1;$$

- a* and b*: the colors in reflection a* and b* in the LAB system measured under illuminant D65 at 2° observer conditions;
- WVTR (water vapor transfer rate): the water vapor transmission rate in $g/m^3$·day, measured using the MOCON AQUATRAN system at 37.8° C. and 100% relative humidity with an 8 hour cycle [NB: the detection threshold of the MOCON system is $5\times10^{-4}$ $g/m^2$·day].

TABLE 1

|  | Example | |
| --- | --- | --- |
|  | No. 1 | No. 2 |
| PET | 0.125 mm | 0.125 mm |
| $Si_3N_4$ | 20 nm | 30 nm |
| SnZnO | 5 nm | 5 nm |
| ZnO | 5 nm | 5 nm |
| Ag | 10 nm | 8 nm |
| Ti | <1 nm | <1 nm |
| ZnO |  | 5 nm |
| SnZnO |  | 60 nm |
| ZnO |  | 5 nm |
| Ag |  | 8 nm |
| Ti |  | <1 nm |
| ITO | 35 nm | 20 nm |
| Properties of the stack |  |  |
| $T_L$ (%) | 83 | 80 |
| $R_L$ (%) | 9 | 11 |
| A (%) | 8 | 9 |
| a* | 2 | 5 |
| b* | 3 | 10 |
| WVTR (g/m²·day) | <10⁻² | <5 × 10⁻³ |

It is apparent from table 1 above that the electrodes having thin layers of silver from the prior art already have barrier properties, with WVTR values of less than $10^{-2}$ $g/m^2$·day. It may also be noted that the barrier properties are better for the electrode having two layers of silver than for the electrode having a single layer of silver. Generally, the use of an electrode having two or three thin layers of silver as a barrier to moisture and gases is advantageous.

In accordance with the invention, the barrier properties are further improved by including a barrier stack directly in the stack of the electrode having thin layers of silver, at at least one of the two antireflection coatings located at the ends of the stack of the electrode, via a magnetron route.

Examples of such improved electrodes having one layer of silver (examples No. 3, 4, 5, 6, 7), deposited on a flexible substrate made of poly-ethylene terephthalate (PET) having a geometric thickness of 0.125 mm, are given in table 2 below. As before, in these examples, the polyethylene terephthalate substrate comprises, on one of its faces, an interfacial layer based on acrylic resin, crosslinked under UV radiation and having a micron-size thickness, which is positioned against the electrode. In table 2 below, the notation "PET" denotes the polyethylene terephthalate substrate coated with the interfacial layer based on acrylic resin.

The properties of the stacks given in table 2 are determined in the same way as for table 1.

TABLE 2

|  | Example | | | | |
| --- | --- | --- | --- | --- | --- |
|  | No. 3 | No. 4 | No. 5 | No. 6 | No. 7 |
| PET | 0.125 mm | 0.125 mm | 0.125 mm | 0.125 mm | 0.125 mm |
| SnZnO |  | 32 nm |  |  |  |

TABLE 2-continued

| | Example | | | | |
|---|---|---|---|---|---|
| | No. 3 | No. 4 | No. 5 | No. 6 | No. 7 |
| Barrier stack $B_1$ | $Si_3N_4$ 50 nm<br>ZnO 50 nm<br>$Si_3N_4$ 50 nm<br>ZnO 10 nm | | $Si_3N_4$ 50 nm<br>$SiO_2$ 50 nm<br>$Si_3N_4$ 50 nm<br>ZnO 10 nm | SnZnO 50 nm<br>$Si_3N_4$ 50 nm<br>SnZnO 50 nm<br>ZnO 10 nm | $Si_3N_4$ 65 nm<br>ZnO 65 nm<br>$Si_3N_4$ 65 nm<br>ZnO 5 nm |
| ZnO | | 10 nm | | | |
| Ag | 8 nm | 8 nm | 9 nm | 8 nm | 8 nm |
| Ti | <1 nm | <1 nm | <1 nm | <1 nm | <1 nm |
| Barrier stack $B_2$ | | $Si_3N_4$ 41 nm<br>ZnO 60 nm<br>$Si_3N_4$ 65 nm | | | $Si_3N_4$ 61 nm<br>ZnO 65 nm<br>$Si_3N_4$ 38 nm |
| ITO | 43 nm | | 55 nm | 43 nm | |
| Properties of the stack | | | | | |
| $T_L$ (%) | 88.8 | 80 | 85.6 | 88 | 80 |
| $R_L$ (%) | 6.8 | 16 | 9.8 | 6.8 | 16.8 |
| A (%) | 4.8 | 4 | <5 | <6 | 3.2 |
| a* | 0.1 | 22 | 0 | 2 | 22 |
| b* | −0.8 | 9 | 0 | −2.3 | −6 |
| WVTR ($g/m^2 \cdot day$) | $<5 \times 10^{-4}$ | $<5 \times 10^{-4}$ | $<10^{-3}$ | $<10^{-3}$ | $<5 \times 10^{-4}$ |

In examples No. 1 to 7, each ZnO wetting layer enables a good crystallization of the silver and each Ti overblocker layer makes it possible to protect the silver layer during subsequent depositions.

The sheet resistance of the electrodes from examples No. 3 to 7 is less than 5 ohms per square, before and after the test for determining the WVTR with the MOCON system.

It can be seen that the barrier stacks chosen in examples No 3 to 7 make it possible, in the five cases, to achieve:
- a WVTR improved by at least a factor of ten relative to the corresponding electrode from the prior art comprising a single thin layer of silver (comparative example=example No. 1) [it is recalled that the detection threshold of the MOCON system is $5 \times 10^{-4}$ $g/m^2 \cdot day$];
- a good light transmission, of greater than or equal to 80%, and a low absorption.

It may be observed that, for the electrodes having a thin layer of silver from examples No. 3, 4 and 7, where the or each barrier stack comprises an alternation between layers of $Si_3N_4$ in the amorphous state and of ZnO in the crystalline state, the WVTR is lower than in the other examples. Furthermore, the WVTR of examples No. 3, 4 and 7 is improved by at least a factor of ten relative to the electrode from the prior art having two thin layers of silver (example No. 2).

In examples No. 3, 5, 6, neutral colors in reflection are achieved. More neutral colors may be achieved by further optimizing the thicknesses and the barrier stacks. It is noted that, in order to adjust the final colors a* and b*, it is necessary to integrate the information of the active layers of the device. For example, for the OLEDs, a fine adjustment is applied as a function of the thicknesses and of the types of organic layers used.

For each of the examples from tables 1 and 2, the deposition conditions for the layers, which were deposited by magnetron sputtering, are the following:

TABLE 3

| Layer | Target employed | Deposition pressure | Gas |
|---|---|---|---|
| ZnO | 98:2 wt % Zn:Al | $2 \times 10^{-3}$ mbar | $Ar/O_2$ |
| Ti | Ti | $8 \times 10^{-3}$ mbar | Ar |
| Ag | Ag | $8 \times 10^{-3}$ mbar | Ar |

TABLE 3-continued

| Layer | Target employed | Deposition pressure | Gas |
|---|---|---|---|
| ITO | Ceramic target (90/10) | $2 \times 10^{-3}$ mbar | $Ar/O_2$ |
| SnZnO | 34:65:1 wt % SnZn:Sb | $2 \times 10^{-3}$ mbar | $Ar/O_2$ |
| $Si_3N_4$ | 92:8 wt % Si:Al | $2 \times 10^{-3}$ mbar | $Ar/N_2$ |
| $SiO_2$ | 92:8 wt % Si:Al | $2 \times 10^{-3}$ mbar | $Ar/O_2$ |

The invention is not limited to the examples described and shown.

In particular, the invention may be applied for silver electrodes comprising more than one thin layer of silver, especially comprising two or three thin layers of silver. The invention may also be applied for electrodes comprising thin metallic layers which are not based on silver, especially thin layers based on other metals or metal alloys having a high conductivity, such as thin layers of aluminum, copper or gold.

Furthermore, the or each barrier stack of the electrode may comprise any number of superposed thin layers, being greater than or equal to four for a barrier stack located in the antireflection coating $M_1$, and being greater than or equal to three for a barrier stack located in the antireflection coating $M_{n+1}$. It being possible for the chemical compositions and the thicknesses of these layers to be different from those described previously. Preferably, each thin layer of the barrier stack is a doped or undoped oxide, nitride or oxynitride layer. For a given chemical composition of the thin layers of the barrier stack, the respective geometric thicknesses of all of the thin layers of the electrode are advantageously selected, for example using optimization software, so as to maximize the transmission of radiation through the electrode, toward or from the active layers of the device in which the electrode is integrated.

As illustrated in the preceding examples, the alternation of densities and, optionally, of refractive indices between the successive thin layers of each barrier stack may be obtained, for each pair of successive thin layers, by a change of chemical nature between the two layers. They may be stacks comprising an alternation between, on the one hand, thin layers having a chemical composition of the $MO_x$, $MN_y$ or $MO_xN_y$ type, optionally hydrogenated, carbonated or doped, where M is a metal, for example chosen from Si, Al, Sn, Zn, Zr, Ti, Hf, Bi, Ta or mixtures thereof and, on the other hand, thin layers having a chemical composition of the M'O$_x$, M'N$_y$ or M'O$_x$N$_y$ type, optionally hydrogenated, carbonated or doped, where M' is a metal different from the metal M, for example also chosen from Si, Al, Sn, Zn, Zr, Ti, Hf, Bi, Ta or mixtures thereof. Thus, as illustrated previously, the constituent stack of each barrier stack may involve an alternation between thin layers of Si$_3$N$_4$ and thin layers of ZnO or SiO$_2$. As a variant and by way of example, it is also possible to envisage constituent barrier layer stacks involving an alternation between thin layers of AlO$_x$ or of SnZnO$_x$ and thin layers of SiO$_x$C$_y$.

As a variant, the alternation of densities and, optionally, of refractive indices between the successive thin layers of each barrier stack may be obtained by the superposition of thin layers of the same chemical nature but of different stoichiometries. In this case, the chemical composition of each thin layer of the barrier stack may be of the MO$_x$, MN$_y$ or MO$_x$N$_y$ type, optionally hydrogenated, carbonated or doped, where M is a metal, for example chosen from Si, Al, Sn, Zn, Zr, Ti, Hf, Bi, Ta or mixtures thereof, and the values of x and y vary for each pair of successive thin layers of the barrier stack. Examples of chemical compositions of a barrier stack where the thin layers of the stack have the same chemical nature but different stoichiometries comprise, in particular, single oxides such as silicon oxide SiO$_x$ or aluminum oxide AlO$_x$, mixed oxides such as the mixed zinc and tin oxide Sn$_x$Zn$_y$O$_z$, generally non-stoichiometric and in the amorphous phase, nitrides such as silicon nitride SiN$_x$, oxynitrides such as silicon oxynitride SiO$_x$N$_y$, or else hydrogenated or carbonated forms of these oxides, nitrides or oxynitrides such as SiN$_x$H$_y$ or SiO$_x$C$_y$.

Furthermore, when the layers of the electrode are deposited on the polymer layer, an organic interfacial layer, for example of acrylic or epoxy resin type, or hybrid organic-inorganic type may be placed beforehand on the polymer layer so as in particular to provide a smoothing or planarization function.

Finally, a device according to the invention may be any type of multilayer electronic device, without being limited to the OLED, photovoltaic and electrochromic devices described and shown. In particular, the invention may be applied for any type of thin-film photovoltaic modules, whether the absorber layer is a thin layer based on amorphous or microcrystalline silicon, based on cadmium telluride, or based on a chalcopyrite compound, especially CIS or CIGS. It may also be applied to organic photovoltaic cell modules, the organic absorber layer of which is particularly sensitive to environmental conditions, or else to modules in which the photovoltaic cells are formed from polycrystalline or single-crystal silicon wafers forming a p/n junction. The invention may also be applied to modules made up of Grätzel cells with a photosensitive pigment, also called DSSCs (dye-sensitized solar cells), for which exposure to moisture may result, apart from electrode deterioration, in a malfunction of the electrolyte, causing undesirable electrochemical reactions. Another example of multilayer electronic devices to which the invention is applicable is inorganic electroluminescent devices, the active part of which comprises an active medium inserted between dielectrics, where the active medium is composed of a crystal lattice that acts as a host matrix, especially one based on sulfides or oxides, and of a dopant that gives rise to the luminescence, for example ZnS:Mn or SrS:Cu, Ag.

A preferred process for manufacturing a device in accordance with the invention, comprising a polymer layer and an electrode made up of thin metallic layers incorporating a barrier function, comprises the deposition of all of the thin layers of the electrode, including the layers of the or each barrier stack, by magnetron sputtering.

In this process, a plasma is created in a high vacuum close to a target comprising the chemical elements to be deposited. The active species of the plasma, on bombarding the target, tear off said chemical elements which are deposited on the substrate, forming the desired thin layer. This process is a "reactive" process when the layer is made of a material resulting from a chemical reaction between the elements torn off from the target and the gas contained in the plasma. The major advantage of this process lies in the possibility of depositing a very complex stack of layers on one and the same line by making the substrate pass in succession beneath various targets.

Sputtering makes it possible to vary certain physico-chemical characteristics of the barrier stack, especially the density, the stoichiometry, and the chemical composition, by modifying parameters such as the pressure in the deposition chamber, the power and the nature or amount of reactive gas. In particular, an increase in the pressure favors the formation of less dense layers.

Deposition techniques other than magnetron sputtering are possible for depositing the layers of the barrier stacks of the electrode, but are less preferred since they do not enable a continuous deposition of all the layers of the electrode. The layers of the electrode are then deposited according to mixed processes combining magnetron sputtering, especially for the deposition of the thin metallic layers, and one or more other deposition techniques for the deposition of the layers of the barrier stacks. Other possible techniques for the deposition of at least some of the layers of the barrier stacks of the electrode comprise, in particular, chemical vapor deposition (CVD), especially plasma-enhanced chemical vapor deposition (PECVD), atomic layer deposition (ALD) or evaporation techniques.

It is noted that the layers of the electrode are not necessarily deposited on the polymer layer against which the electrode is positioned. Thus, by way of example, for the devices from FIGS. 1 and 2, which are manufactured in superstrate mode, the thin layers of the electrode are deposited successively on the polymer substrate 1, whereas for the devices from FIGS. 3 and 4, which are manufactured in substrate mode, the thin layers of the electrode 3 are deposited successively on the active layer 106, 206, the polymer lamination interlayer being added onto the electrode in a subsequent step.

The invention claimed is:

1. A multilayer electronic device, comprising:
   an organic polymer layer;
   an electrode positioned against the organic polymer layer, the electrode being constituted by a transparent stack of thin layers comprising an alternation of n thin metallic layers and of (n+1) antireflection coatings, with n≥1, where each thin metallic layer is placed between two antireflection coatings, wherein the electrode comprises:
   a first barrier stack, which is a barrier to moisture and to gases, in the end antireflection coating which is placed under the n thin metallic layers in the direction of deposition of the constituent stack of the electrode, the first barrier stack comprising at least four layers having alternately lower and higher densities,
   and/or
   a second barrier stack, which is a barrier to moisture and to gases, in the end antireflection coating which is placed on top of the n thin metallic layers in the direction of deposition of the constituent stack of the electrode, the second barrier stack comprising at least three layers having alternately lower and higher densities.

2. The device as claimed in claim 1, wherein each antireflection coating which is placed under, in the direction of deposition of the constituent stack of the electrode, a thin metallic layer comprises, as layer subjacent to the thin metallic layer, a wetting layer based on crystalline oxide.

3. The device as claimed in claim 2, wherein the wetting layer is based on zinc oxide.

4. The device as claimed in claim 1, wherein each antireflection coating that is placed on top, in the direction of deposition of the constituent stack of the electrode, of a thin metallic layer comprises, as layer superjacent to the thin metallic layer, an oxidized or unoxidized thin metallic overblocker layer.

5. The device as claimed in claim 1, wherein at least one barrier stack of the electrode comprises at least three successive layers having alternately lower and higher degrees of crystallinity, the ratio of the degree of crystallinity of a layer of higher degree of crystallinity to the degree of crystallinity of a layer of lower degree of crystallinity being greater than or equal to 1.1.

6. The device as claimed in claim 5, wherein said at least three successive layers are alternately in an amorphous state and in an at least partially crystalline state.

7. The device as claimed in claim 1, wherein the constituent layers of the or each barrier stack of the electrode have alternately lower and higher refractive indices.

8. The device as claimed in claim 1, wherein for the or each barrier stack of the electrode, each thin layer of the barrier stack has a geometric thickness of less than 200 nm.

9. The device as claimed in claim 8, wherein for the or each barrier stack of the electrode, each thin layer of the barrier stack has a geometric thickness of less than 100 nm.

10. The device as claimed in claim 1, wherein, for the or each barrier stack of the electrode, each thin layer of the barrier stack is a doped or undoped oxide, nitride or oxynitride layer.

11. The device as claimed in claim 1, wherein the organic polymer layer comprises an organic or hybrid organic-inorganic interfacial layer which is positioned against the electrode.

12. The device as claimed in claim 1, wherein the organic polymer layer is a substrate of the device.

13. The device as claimed in claim 1, wherein the organic polymer layer is a lamination interlayer for bonding with a substrate of the device.

14. The device as claimed in claim 1, wherein the device is an organic light-emitting diode device, where the electrode is an electrode of the organic light-emitting diode and the organic polymer layer is all or part of a structure for encapsulating the organic light-emitting diode.

15. The device as claimed claim 1, wherein the device is a photovoltaic device, where the electrode is an electrode of the photovoltaic cell and the organic polymer layer is all or part of a structure for encapsulating the photovoltaic cell.

16. The device as claimed in claim 1, wherein the device is an electrochromic device, where the electrode is an electrode of the electrochromic system and the organic polymer layer is all or part of a structure for encapsulating the electrochromic system.

17. A process for manufacturing a device as claimed in claim 1, wherein at least some of the thin layers of the or each barrier stack are deposited by sputtering.

18. The manufacturing process as claimed in claim 17, wherein all of the thin layers of the constituent stack of the electrode, including the layers of the or each barrier stack, are deposited by sputtering.

19. The manufacturing process as claimed in claim 18, wherein all of the thin layers of the constituent stack of the electrode, including the layers of the or each barrier stack, are deposited by magnetron sputtering.

20. The manufacturing process as claimed in claim 17, wherein the at least some of the thin layers of the or each barrier stack are deposited by magnetron sputtering.

21. The device as claimed in claim 1, wherein the n thin metallic layers of the electrode are based on silver or on a metal alloy containing silver.

22. A method comprising arranging in a multilayer electronic device a multilayer component comprising
an organic polymer layer;
an electrode positioned against the organic polymer layer, the electrode being constituted by a transparent stack of thin layers comprising an alternation of n thin metallic layers and of (n+1) antireflection coatings, with where each thin metallic layer is placed between two antireflection coatings and where the electrode comprises:
a first barrier stack, which is a barrier to moisture and to gases, in the end antireflection coating which is placed under the n thin metallic layers in the direction of deposition of the constituent stack of the electrode, the first barrier stack comprising at least four layers having alternately lower and higher densities,
and/or
a second barrier stack, which is a barrier to moisture and to gases, in the end antireflection coating which is placed on top of the n thin metallic layers in the direction of deposition of the constituent stack of the electrode, the second barrier stack comprising at least three layers having alternately lower and higher densities.

23. The method as claimed in claim 22, wherein the n thin metallic layers of the electrode are based on silver or on a metal alloy containing silver.

* * * * *